United States Patent
Westwick et al.

(10) Patent No.: US 7,421,251 B2
(45) Date of Patent: Sep. 2, 2008

(54) PRECISE FREQUENCY GENERATION FOR LOW DUTY CYCLE TRANSCEIVERS USING A SINGLE CRYSTAL OSCILLATOR

(75) Inventors: Alan L. Westwick, Austin, TX (US); Douglas R. Holberg, Wimberley, TX (US)

(73) Assignee: Silicon Laboratories Inc., Austin, TX (US)

( * ) Notice: Subject to any disclaimer, the term of this patent is extended or adjusted under 35 U.S.C. 154(b) by 605 days.

(21) Appl. No.: 11/095,229

(22) Filed: Mar. 31, 2005

(65) Prior Publication Data

US 2006/0223454 A1    Oct. 5, 2006

(51) Int. Cl.
*H04B 1/40* (2006.01)
(52) U.S. Cl. .................... 455/85; 455/574; 455/86; 455/141; 343/16
(58) Field of Classification Search ............ 455/85, 455/574, 86, 141, 146, 147, 196.1, 255; 343/16, 343/17

See application file for complete search history.

(56) References Cited

U.S. PATENT DOCUMENTS

| | | | | |
|---|---|---|---|---|
| 5,708,971 A | * | 1/1998 | Dent | ............ 340/7.22 |
| 5,831,485 A | * | 11/1998 | Nelson et al. | ............ 331/47 |
| 5,940,742 A | * | 8/1999 | Dent | ............ 340/7.22 |
| 6,088,593 A | * | 7/2000 | Dent | ............ 455/456.1 |
| 7,283,000 B2 | * | 10/2007 | Yang et al. | ............ 331/1 A |
| 7,315,213 B2 | * | 1/2008 | Yamanaka et al. | ............ 331/2 |
| 2005/0047260 A1 | * | 3/2005 | Yamasaki et al. | ............ 365/232 |
| 2005/0221870 A1 | * | 10/2005 | Erdelyi et al. | ............ 455/574 |
| 2007/0296508 A1 | * | 12/2007 | Yang et al. | ............ 331/1 A |
| 2007/0296509 A1 | * | 12/2007 | Yang et al. | ............ 331/1 A |

* cited by examiner

*Primary Examiner*—Matthew Anderson
*Assistant Examiner*—Minh D Dao
(74) *Attorney, Agent, or Firm*—Howison & Arnott, L.L.P.

(57) ABSTRACT

An apparatus and method for calibrating a non-crystal oscillator in a transceiver unit using a crystal-oscillator includes the step of establishing a time base based upon oscillations of the crystal oscillator. A comparison of the number of oscillations for the non-crystal oscillator and the crystal oscillator is made during a known time period is made. An adjustment is determined based upon the established time base and the compared number of oscillations. The transceiving of the transceiver unit is then controlled based upon this adjustment.

13 Claims, 3 Drawing Sheets

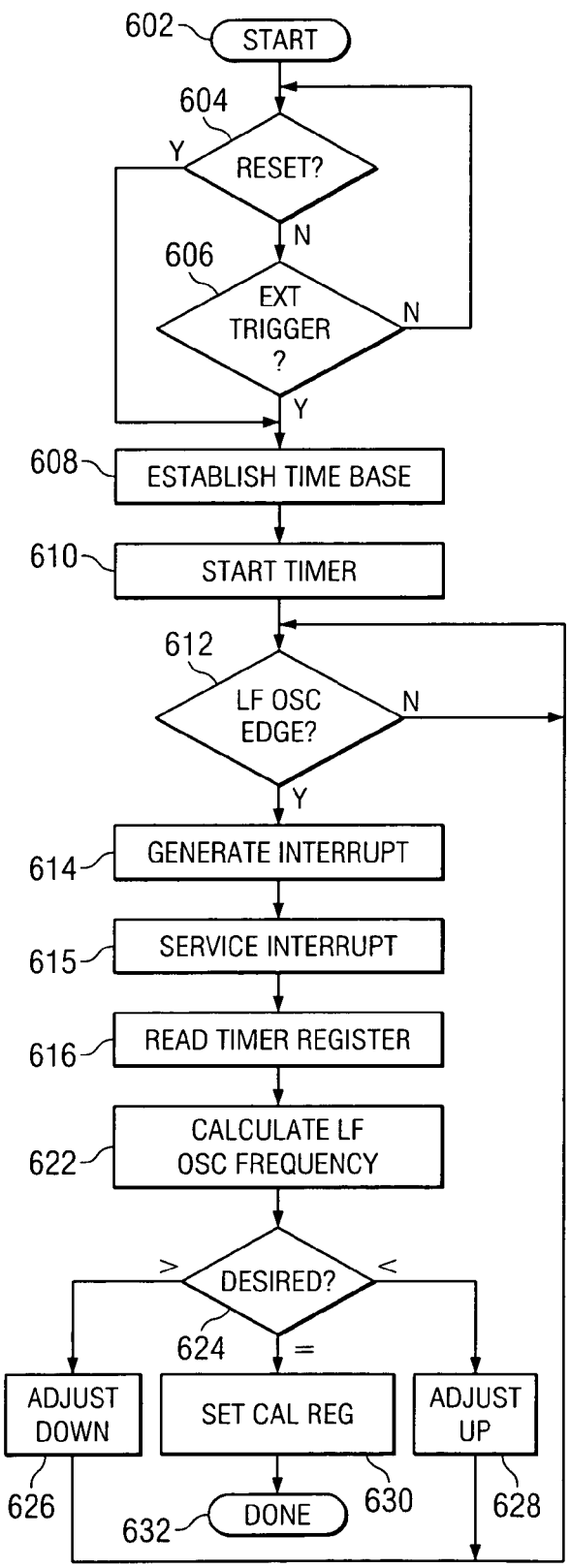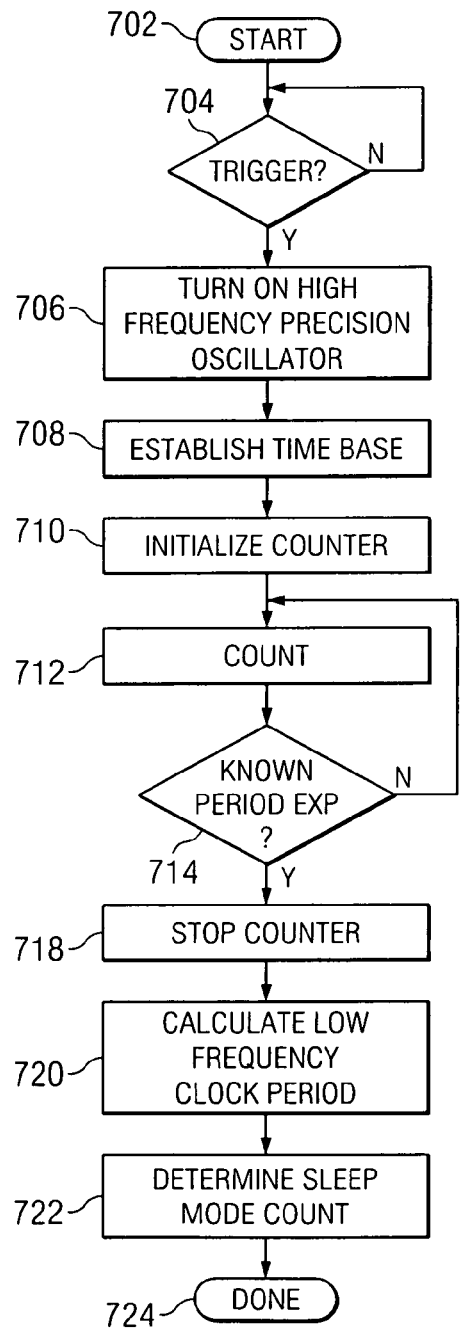

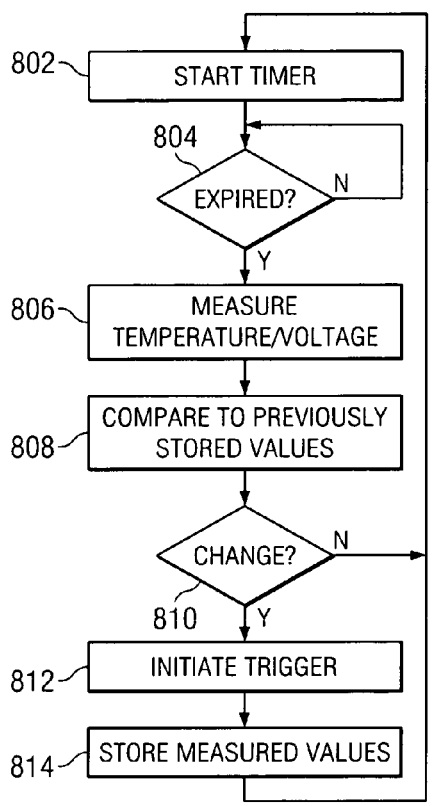
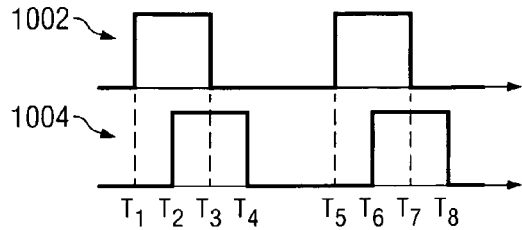
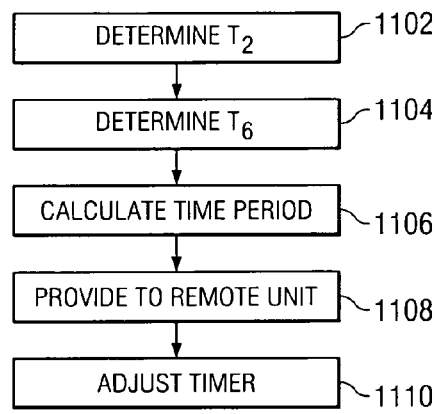
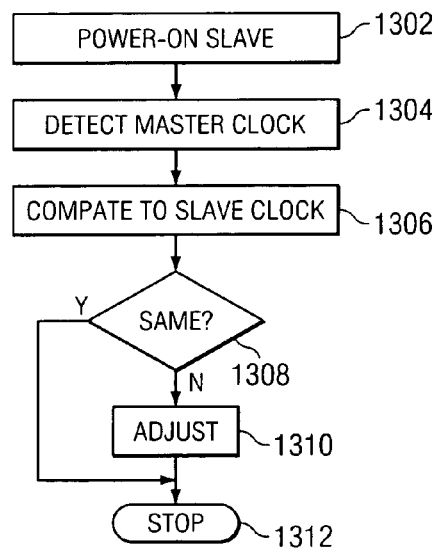
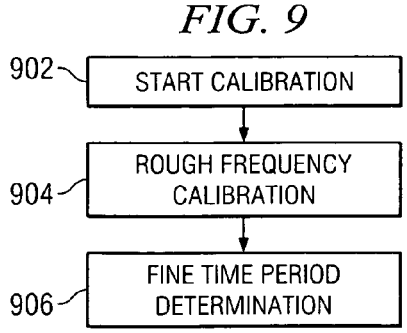
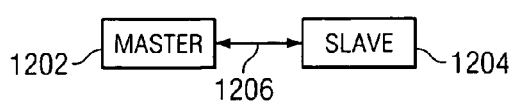

PRECISE FREQUENCY GENERATION FOR LOW DUTY CYCLE TRANSCEIVERS USING A SINGLE CRYSTAL OSCILLATOR

CROSS-REFERENCE TO RELATED APPLICATIONS

This application is related to U.S. patent application Ser. No. 10/865,110 filed on Jun. 10, 2004 and entitled "Method and Apparatus for Calibration of a Two Frequency Oscillator in a Processor-Based System," which is incorporated herein by reference.

TECHNICAL FIELD OF THE INVENTION

The present invention relates to the synchronization of an oscillator for low duty cycle transceivers, and more particularly, to the synchronization of an oscillator for a low duty cycle transceiver using a single crystal oscillator.

BACKGROUND OF THE INVENTION

The IEEE 802.15.4 Standard provides a radio data transceiver protocol that is optimized for low data rate, short range, low power and cost. The low power is partly a consequence of the low data rate and short range, but the standard also provides for varied low duty cycle modes in which the tranceivers will stay in a sleep state for most of the time, periodically waking up to communicate short bursts of data. In a typical 802.15.4 transceiver, two crystal oscillators are used. One crystal is a 32.768 KHz real time clock (RTC) oscillator that provides accurate timing for the system during sleep mode, so that the transceiver knows when to wake up and communicate with other devices. Because of the low frequency, this is a very low power circuit drawing only a few micro amps and allowing for a multi-year battery life. The other oscillator crystal typically comprises a 10 to 30 MHz crystal (16 MHz is the most common frequency) oscillator and is used as the reference frequency for the RF PLL frequency synthesizer and is used to operate the MCU and other digital circuitry when the device is powered on. This crystal oscillator typically consumes 400 to 800 micro amps by itself which is far too much current for the requirements of a sleep mode. The voltage-controlled oscillator (VCO) inside the RF PLL frequency synthesizer typically operates at 900 MHz to 5 GHz for 802.15.4 systems and it consumes a few mA (a few thousand micro amps), so the VCO operates only when the device is actually transmitting or receiving data.

The requirements for frequency stability vary among the three oscillators. The most stringent requirements are for the RF oscillator. The 802.15.4 Standard specifies that the oscillator must have a frequency error of less than 40 ppm over all operating conditions including temperature. This is usually achieved by phase locking to the 16 MHz crystal oscillator, so that the 40 ppm requirement transfers to that oscillator. A typical communications grade crystal could have an initial "make" tolerance of +/−10 ppm, and a temperature variation of +\−20 ppm over the industrial temperature range (−40 C to +85 C) for a total tolerance of +/−30 ppm. Some margin must be provided for other error sources such as variation in the load capacitance. In many applications, the temperature ranges would be more restrictive, allowing a looser initial tolerance. For example, the crystals mentioned above may have a temperature variation of only 10 ppm over −20° C. to +70° C.

The RTC oscillator should have good accuracy and stability. However, it doesn't need to be at 40 ppm across all operating conditions. This is particularly true for reduced function devices. One type of 802.15.4 network consists of line-powered network coordinator devices, which are always powered on, and battery-powered reduced function devices, which spend most of their time in sleep mode. In a reduced function device, there is a trade off in the tolerance of the RTC versus power consumption, since an inaccurate RTC will require the device to come out of sleep mode sooner so that it can be guaranteed to receive the beacon from the network coordinator. The network coordinator device should have better timing accuracy so that the RTC frequency errors between the slave and the coordinator are not compounded. A typical 32.768 KHz crystal has an initial tolerance of 20 ppm but a strongly parabolic frequency versus temperature curve with a maximum frequency occurring at 25 C and an error of typically −70 ppm at both −20 C and +70 C. At the extremes of the −40 C to +85 C temperature range, the frequency error will exceed 100 ppm. Therefore, in applications such as network coordinators in which sleep-mode current consumption is not important, it may be preferable to derive the RTC clock signal from the 16 MHz crystal oscillator because of its higher accuracy compared to a 32.768 KHz crystal oscillator. However, as noted earlier, this is not an option for battery-powered reduced function devices because a 16 MHz crystal oscillator typically consumes more than 100 times as much current as a 32.768 KHz crystal oscillator. These battery powered devices thus generally require both crystal oscillators, adding considerably to the cost and physical size of the transceiver. It should be pointed out that it is possible to build oscillators that do not employ a crystal as the frequency-determining element, but they do not have accuracy sufficient to meet the requirements of 802.15.4 or similar systems.

There is a need for minimizing the hardware required to implement the low duty cycle transceivers utilized in systems similar to the 802.10.4 system. Some manner of achieving this would greatly benefit the design of such systems. Furthermore, the power consumption of such transceivers may be reduced if the accuracy of the RTC clock is improved relative to that obtained from using a standard 32.768 KHz crystal oscillator as the clock source.

SUMMARY OF THE INVENTION

The present invention disclosed and claimed herein, in one aspect thereof, comprises an apparatus and method for calibrating a non-crystal oscillator in a remote unit using a crystal oscillator. A time base is established based upon the oscillations of the crystal oscillator. The number of oscillations for the non-crystal oscillator and the crystal oscillator are compared during a known time period. An adjustment is determined based upon the established time base and the compared number of oscillations. Transceiving of the remote unit is then controlled responsive to this adjustment.

BRIEF DESCRIPTION OF THE DRAWINGS

For a more complete understanding of the present invention and the advantages thereof, reference is now made to the following description taken in conjunction with the accompanying Drawings in which:

FIG. 6 is a flow diagram illustrating a first manner for synchronizing a frequency of an oscillator within a remote transceiver unit with the frequency of a crystal oscillator;

FIG. 7 is a flow diagram illustrating a method for synchronizing a timer period with respect to an oscillator crystal;

FIG. 8 illustrates a flow diagram describing the triggering of a synchronization of a remote transceiver unit using an oscillator crystal;

FIG. 9 is a flow diagram illustrating a method for synchronizing a remote transceiver unit with an oscillator crystal using both the methods illustrated in FIGS. 6 and 7;

FIG. 10 illustrates an alternative method for determining synchronization between a remote transceiver unit and a controlling unit;

FIG. 11 is a flow diagram illustrating the manner for determining the timing difference between a remote unit and a controlling unit;

FIG. 12 illustrates a master/slave configuration between a remote transceiving unit and a master controller unit; and FIG. 13 is a flow diagram illustrating the manner for synchronization between a low duty cycle transceiver and a master controller.

DETAILED DESCRIPTION OF THE INVENTION

Figure 1:
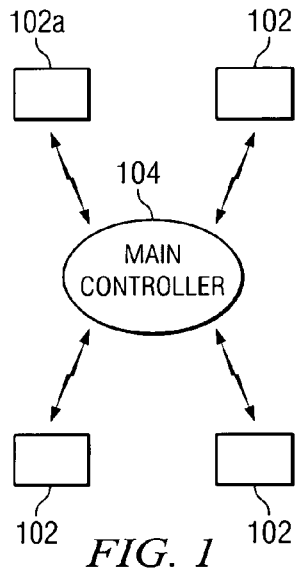
FIG. 1 illustrates a network including a main controller and a number of remote transceivers.
Figure 2:
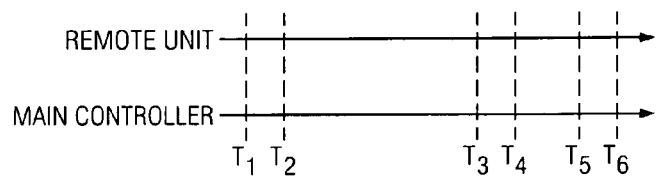
FIG. 2 is a timing diagram illustrating communications between a main controller and remote tranceivers.

Referring now to the drawings, and more particularly to FIG. 1, there is illustrated a network operating according to, for example, the 802.15.4 protocol or other short range wireless communications protocol wherein a plurality of remote transceiver units 102 are in wireless communication with a main controller 104 using a short range wireless protocol. In order to enable communication between the remote transceiver units 102 and the main controller 104 while maintaining battery power at the remote transceiver units 102, an assigned slot communication protocol must be utilized. Thus, as illustrated in FIG. 2, the remote transceiver units 102 and the main controller unit 104 have an initial communication period where they are in communication with each other from time $t_1$ to time $t_2$. Remote transceiver unit 102a and the main controller unit 104 each know that this is the time period for the remote transceiver unit 102a to communicate with the main controller unit 104. During this time period the remote transceiver unit 102a is in a transmit or receive mode and the main controller 104 is in the complimentary transmit or receive mode to receive or provide data to the remote transceiver unit 102. As long as each unit is properly synchronized to determine the time period between time $t_1$ and $t_2$, the communications between the devices will be received.

However, if the main controller unit 104 and the remote transceiver unit 102a are not synchronized with each other, a situation may occur as is illustrated at time periods $t_3$-$t_4$ and time periods $t_5$-$t_6$. In this case, the remote transceiver unit 102a is expecting communications to occur at the time period between $t_3$ and $t_4$. However, the main controller unit 104 expects communications to occur in the time period from $t_5$ to $t_6$. Each of the devices is expecting communications to occur in separate distinct non-overlapping time periods. Thus, no communications are able to take place between the units since the clocks are not properly synchronized and their transmission periods do not overlap and occur at the same time period. The clocks at the remote transceiver units 102 enable the device to be turned off and on at the appropriate times to enable communications but conserve battery power. These clocks at the remote transceiver units 102 may take on a number of configurations.

Figure 3:
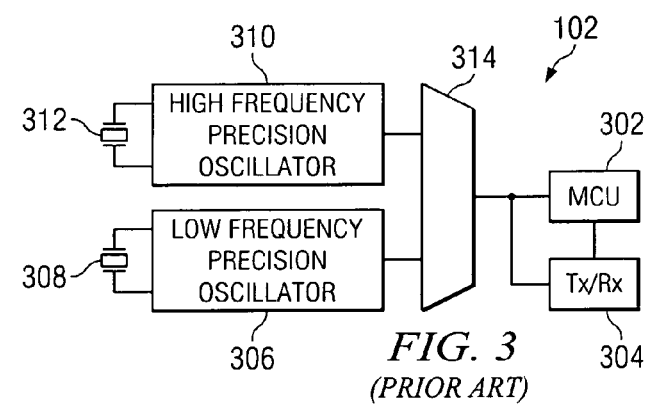
FIG. 3 illustrates a prior art embodiment of a remote unit using a pair of oscillator crystals.

Referring now to FIG. 3, there is illustrated a prior art embodiment of a portion of a remote transceiver unit 102. In this embodiment, the remote transceiver unit 102 includes a micro controller unit (MCU) 302 connected with transceiver circuitry 304. The transceiver circuitry 304 enables communication with the main controller unit 104 described with respect to FIG. 1. A low frequency precision oscillator 306 enables operation of the remote transceiver unit 102 during a sleep mode. The device will stay in the sleep mode for most time periods and requires the oscillator 306 in order to determine periods when to wake up the remote transceiver unit for communication with the main controller 104. In order to enable the low frequency oscillator 306 to maintain an accurate clock signal, a low frequency crystal 308 is used. In a preferred embodiment the low frequency oscillator crystal is a 32.768 KHz real time clock (RTC) oscillator crystal. Because of the low frequency, this is of course a very low power circuit making it ideal for operation in low power sleep modes.

A high frequency oscillator 310 is used for providing a clock signal to the MCU 302 and transceiver circuitry 304 during transmissions between the remote transceiver unit 102 and a main controller 104 during high power operations. The high frequency oscillator is driven by a high frequency oscillator crystal 312. In a preferred embodiment this is a 16 MHz oscillator crystal. However, a crystal operating at other frequencies may also be used. The high frequency oscillator crystal 312 is used as the reference frequency for the RF PLL frequency synthesizer and to operate the MCU 302 and other digital circuitry when a device is powered on. The clock signals from the high frequency oscillator 310 and the low frequency oscillator 306 are each applied to a multiplexor 314 which applies the appropriate clock signal to the MCU 302 and transceiver circuitry 304 depending upon the operating mode (sleep or powered) in which the remote transceiver unit 102 is presently operating.

Figure 4:
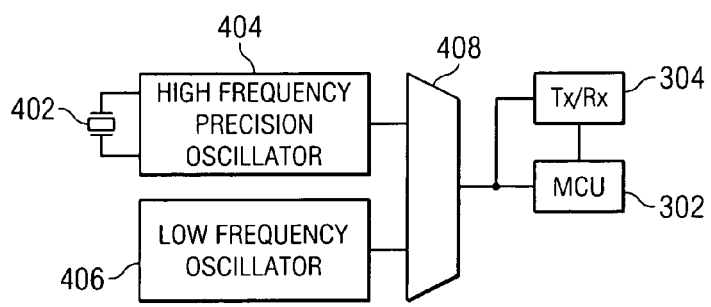
FIG. 4 illustrates a first embodiment of a remote transceiver unit including only a single oscillator crystal.

Referring now to FIG. 4, there is illustrated a first embodiment of the present method for operating a remote transceiver unit 102 using only a single oscillator crystal. The configuration of the remote transceiver unit 102 is the same as that described herein above with respect to FIG. 3 except only a single high frequency oscillator crystal 402 is utilized with respect to the high frequency oscillator 404 and the low frequency oscillator 406. The low frequency oscillator 406 does not include a separate crystal to operate therewith. Instead, oscillator 406 would typically use an RC (resistor-capacitor) time constant to establish the oscillation frequency. However, inherent manufacturing variations in the values of the resistor and capacitor will cause the initial accuracy of the low frequency oscillator to be poor. If the resistor and/or capacitor values were made to be adjustable, then it would be possible to tune the oscillator to the desired frequency, provided that there was a precise reference frequency available to which the frequency of oscillator 406 could be compared. Thus, the high frequency crystal 402 may be used to calibrate the low frequency oscillator 406 by using one of a number of techniques which will be described herein below. As before, the output signals of the low frequency oscillator 406 and high frequency oscillator 404 are provided to a multiplexor 408 that provides the appropriate clock signal to the MCU 302 and transceiver circuitry 304.

Figure 5:
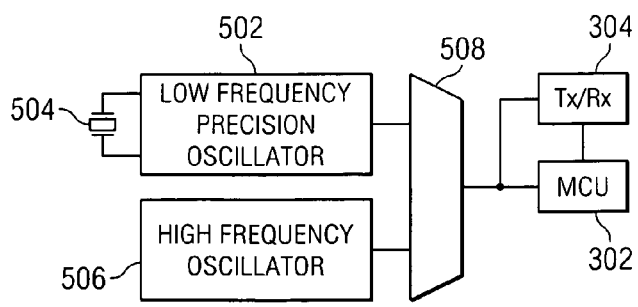
FIG. 5 illustrates an alternative embodiment for a remote transceiver unit including a single oscillator crystal.

Referring now to FIG. 5, rather than utilizing a high frequency oscillator crystal, the remote transceiver unit 102 may be configured such that the low frequency oscillator 502 includes a low frequency crystal 504. The high frequency oscillator 506 will not include a crystal and the high frequency oscillator 506 would be calibrated with the low frequency crystal 504 of the low frequency oscillator 502. A number of problems are inherent with this use of the low frequency crystal 504 which will be discussed herein below. The outputs of the low frequency oscillator 502 and high frequency oscillator 506 are provided to the inputs of a multiplexor 508. The multiplexor 508 provides the appropriate clock signal for operating the micro controller unit 302 and transceiver circuitry 304.

Referring now to FIG. 6, there is illustrated a flow diagram for the calibration operation that alters the frequency of the low frequency oscillator based upon the clock signal from the high frequency crystal. This is initiated at block 602 and then proceeds to decision block 604 to determine if a reset event has been received. A reset event may include any number of things including expiration of a sleep period between the remote transceiver unit 102 and the main controller 104 or detection of a change in voltage or temperature conditions which may alter the frequency of the low frequency oscillator. If decision block 606 determines that an external trigger indicating that a request for a calibration operation has been received or if a reset operation has been received, the program flows from either of decision blocks 604 or 606 to a function block 608 to establish a time base to which calibration is to be made. As described herein above, this time base is the output of the high frequency crystal controlled oscillator. When the calibration is initiated, if the system is operating in the low power mode, it will be necessary to turn on the high frequency oscillator as it may be powered down for power conservation purposes, or it may be that all that is required is selection of the output of the already running high frequency oscillator. In any event, this high frequency oscillator will provide the time base, a known frequency, to which the low frequency clock is calibrated. However, if either a reset signal or an external signal is not received, the program will flow back along the "N" path back to the input of decision block 804.

Once the reset or trigger has been received and a time base established, the program flows to a function block 610 wherein a timer is started. This timer is clocked by the high frequency clock (possibly a divided down clock) to count the pulses associated therewith. It is noted that these pulses are at a frequency that is higher than that of the low frequency clock. The program then flows to a decision block 612 to determine if the low frequency oscillator edge has occurred. This could either be a falling edge or a rising edge, depending upon how the timer is configured. However, it will only look for either a falling or rising edge. When the particular edge occurs, the program flows along a "Y" path to a function block 614 wherein an interrupt is generated. This interrupt is input to the MCU. Additionally, the interrupt operation will cause the data or the value of the register to be transferred to a register. Of course, the timer continues to count. The program then flows to a function block 615, wherein the MCU will service the interrupt. During servicing of this interrupt, the program will flow to a function block 616 wherein the contents of the register will be read. The program then flows to a function block 622 wherein the currently read value from the register is compared to a previously read value. With two successive values for two successive rising (or falling) edges of the low frequency clock, the period of the low frequency clock can be calculated. This is indicated at function block 622. The program then flows to decision block 624 to determine if the calculated frequency is at the desired frequency. If the calculated frequency is greater than the desired frequency, the program flow flows to a function block 626 to increment the frequency of the low frequency oscillator downward and then flows back to the input of decision block 812 to await the next low frequency oscillator edge. If it is less than a desired frequency, the program flows to a function block 628 to adjust the frequency of the low frequency oscillator incrementally upwards, and then back to the input of the decision block 812. The value of the frequency is adjusted upward and downward using a capacitor array or CDAC. If a CDAC were used to adjust the frequency of the on chip oscillator, and the step size is 240 ppm (giving a maximum frequency error of +/−120 ppm) and the maximum value of the CDAC capacitance is 50% of the total capacitance, this would require a 12-bit CDAC which is quite large physically.

If the desired value has been achieved, the program flows to a function block 630 to set the calibration register value and then to a done block 632. The up and down adjustments can be made using either a linear search or a much faster iterative binary search algorithm.

However, it could be that a lookup table is provided that would allow the calculation to be facilitated in the single step rather than iteratively. This of course would require characterization of the oscillator and storage of characterization information in a non-volatile memory.

While altering the frequency of the low frequency oscillator using the high frequency crystal is one method for synchronizing a remote transmission unit to communicate with a main controller 104, it is not critical that the frequency of the low frequency clock be accurate. The only requirement is that the sleep mode timer that is clocked by the low frequency clock give an accurate measure of the length of the sleep mode time period between transmissions. Thus, rather than altering the frequency as described in FIG. 6, an alternative embodiment would be to adjust the count of the timer measuring the sleep period in response to a calibration trigger. FIG. 6 illustrated that the low frequency oscillator would require a 12 bit CDAC to give a frequency resolution of 120 ppm, which amounts to a timing resolution of about 30 mS over a sleep interval of 245 seconds, which is the longest allowed under the 802.15.4 standard. However, the addition or subtraction of one count in the sleep mode timer would give a timing resolution of about 30 micro seconds (assuming that the oscillation frequency is around 32 KHz) regardless of the length of the super frame. Thus, FIG. 7 illustrates a manner for more accurately determining the length of the sleep period without adjusting the frequency of the low frequency clock but instead adjusting a timer count of the sleep mode timer.

The process is initiated at block 702 and proceeds to inquiry block 704 wherein a determination is made if an external trigger or reset has occurred such as a user calibrate input signal or a calibrate signal from some other source such as expiration of a sleep mode timer or altering of temperature or voltage associated with the remote transmission unit. If no triggering events are detected, inquiry block 704 continues to monitor for occurrence of such an event. Once a triggering event is detected by inquiry block 704, the high frequency precision crystal oscillator is turned on at function block 706. In some embodiments it is possible that the high frequency crystal oscillator may already be operating. If so, block 706 becomes optional. Next at function block 708, a time base is established to which calibration is to be made. As described previously, this time base is based on the output or a divided down output of the high frequency precision oscillator driven by the high frequency crystal oscillator. When the calibration is initiated, if the system is operating in low power mode, it may be necessary to turn on the high frequency crystal oscillator as previously mentioned with respect to Step 706.

Once the time base has been established, control flows to function block 710 wherein a counter for counting the number of high-frequency clock pulses that occur during one or more periods of the low-frequency oscillator is initialized on the low frequency oscillator edge. Next at step 712, the counter counts the number of high-frequency clock pulses that occur during one or more periods of the low-frequency oscillator. For example, if the high frequency oscillator is operating at 16 MHz and the low frequency oscillator is operating at 32 kHz, there will be 500 pulses of the high-frequency clock during each period of the low frequency clock. If 20 periods of the low-frequency clock are counted, there will be 10000 pulses of the high-frequency clock during the timing interval. Control then passes to inquiry block 714 to determine, based upon the established time base, whether a selected period of time has expired. If not, control passes back to inquiry block 712. Once a selected period of time has been determined to have expired by inquiry block 714, control passes to function block 718 wherein the counter is stopped. At the end of the timing interval determined at inquiry step 714, the value in the counter will be directly proportional to the period of the low-frequency clock. Longer timing intervals give better precision in the measurement; for instance, if a timing interval of 20 periods of the low-frequency clock is used, the measurement precision will be one part in 10000, which is 100 ppm.

The period (in seconds) of the low-frequency clock is calculated at step 720 by multiplying the period of the high frequency clock (1/16 MHz=62.5 nanoseconds in this example) by the final value in the counter and dividing by the number of low frequency clock periods in the timing interval. As an example, suppose that the value in the counter is 10022 after 20 periods of the low frequency clock. Then the period of the low frequency clock is (10022)(62.5 nsec)/20=31.31875 µsec. The desired sleep time at step 722 can be divided by the measurement of the low frequency clock period to determine a value to be programmed into the sleep mode counter. The sleep mode counter would count the periods of the low frequency clock to determine when to wake the device up. Continuing the above example, if a sleep period of 2.0 seconds is desired, the sleep mode counter would wake up the device after (2.0 sec)/(31.31875 µsec)=63859 periods of the low frequency clock.

Thus, rather than altering the frequency of the low frequency clock to synchronize with the high frequency oscillator crystal, the particular time period associated with, for example, the sleep mode is measured based upon the number of pulses occurring from the low frequency oscillator. This number of pulses may then be stored as a new counter value for the sleep mode timer for a next time period. Therefore, no altering of the frequency of the clock to obtain accurate timing of the sleep mode is necessary. A more accurate measure of the time period is based upon the number of clock pulses provided by the low frequency oscillator no matter what the frequency of the low frequency oscillator. The process is completed at block 724.

Referring now to FIG. 8, there is illustrated a flow diagram more fully describing the trigger steps of FIGS. 6 and 7. One trigger which may be implemented within the afore described remote transceiver unit is a trigger based upon a change in voltage or temperature conditions occurring within the remote transceiver device. The reason for this is that voltage and temperature changes can most drastically affect the frequency of the low frequency oscillator, thus requiring recalibration with respect to the high frequency crystal. The process begins at function block 802 wherein a timer is initiated. Inquiry block 804 determines whether the timer has expired. When a determination is made that the timer has not expired, inquiry block 804 continues to monitor for expiration of the timer. Once inquiry block 804 determines expiration of the timer, a measurement is made of temperature and/or voltage conditions for the remote transceiver unit at function block 806. These measured temperature and/or voltage values are compared at function block 808 to previously stored temperature and/or voltage values to enable a determination at inquiry block 810 of any change from the previously stored values. If no significant change is detected by inquiry block 810, control passes back to function block 802 and the timer is again initiated.

If changes in the previously stored values are detected, control passes to function block 812 to initiate a trigger that starts the calibration process described with respect to either FIG. 6 or FIG. 7. Function block 814 stores the presently measured values such that they may be compared to subsequently measured values in function block 806. Control then returns to function block 802. Rather than using a timer as described with respect to blocks 802 and 804 of FIG. 8, the process for initiating measurement of temperature and voltage sensing may be based upon the detections of interrupts that are created in response to detection of a change in voltage or temperature. In this case, steps 802 and 804 would merely be replaced by an inquiry block that monitored for an occurrence of an interrupt and control would pass onward to step 806. Alternatively, variables other than voltage and temperature may be monitored as triggering events.

The above paragraph describes the use of temperature and/or voltage sensors to trigger a recalibration. This implies that the frequency of the reference oscillator (i.e. the crystal oscillator) is substantially independent of temperature and voltage. However, another use for temperature and voltage sensors is to provide correction for the crystal oscillator. If (by previous characterization) it is known that the crystal oscillator has a particular dependence on temperature or supply voltage, then this information can be used to change the digital values used for calibration. For example, if a 32.768 KHz crystal oscillator is used as the reference, then we know that the crystal oscillator slows down at both high and low extremes of temperature; in other words, it has a parabolic frequency-versus-temperature curve. If a temperature is known, this information can be used to reduce the number of clock cycles that are counted to determine, for example, the sleep time, because the clock itself is slow.

Referring now to FIG. 9, there is illustrated a further embodiment of the disclosure wherein a combination of the processes described with respect to FIGS. 6 and 7 is utilized. The flow chart with respect to FIG. 9 envisions the initiation of the calibration process at function block 902 and initially implementing a rough frequency calibration process at block 904. This rough frequency calibration process would involve altering the frequency of the low frequency oscillator in the manner described with respect to FIG. 6 using, for example, the CDAC described with respect thereto. In this case, the CDAC used for the frequency calibration could include a lesser number of tuning bits than the 12 bit CDAC previously described since only a rough frequency calibration was desired. Next, at function block 906, a finer timer calibration is achieved using the process described with respect to FIG. 7 to measure the length of the sleep mode period based upon a number of pulses of the low frequency oscillator. Thus, the overall structure of the process described with respect to FIG. 9 involves initially calibrating the frequency of the low frequency oscillator to be in a selected range of the frequency of the high frequency oscillator crystal, and then obtaining finer calibration tolerances by adjusting the sleep mode timer value to more accurately measure a desired time period using the roughly calibrated frequency of the low frequency oscillator and the high frequency oscillator crystal to establish a time base.

Referring now to FIGS. 10 and 11, there is illustrated yet a further embodiment of a method for calibrating a low frequency oscillator to a high frequency oscillator clock. FIG. 10 illustrates the active transmission periods for a central controller unit 1002 and a remote transceiver unit 1004. The central controller 1002 has active transmission and reception periods from time $t_1$ to time $t_3$ and from time $t_5$ to time $t_7$. The remote transceiver unit 1004 has active transmission and reception periods from time $t_2$ to time $t_4$ and from time $t_6$ to time $t_8$. Since the remote transceiver unit 1004 is initially active at time points occurring within the active periods of the central controller unit 1002, a determination may be made by the central controller of the length of the sleep mode period being measured by the remote transceiver unit 1004 and provide this information to the remote transceiver unit 1004.

Referring now to FIG. 11 there is illustrated a flow diagram describing this process. At function block 1102, the central controller unit determines the time $t_2$ at which the remote transceiver unit begins transceiving. At function block 1104, the controller unit determines the time $t_6$ at which the remote transceiver unit begins transceiving. By knowing the times at which the remote transceiver unit began transmitting in two successive periods, the time period being measured by the low frequency oscillator clock between transmissions may be determined at function block 1106. This time period is provided to the remote transceiver unit at function block 1108 which may use this information to adjust their timer at Step 1110 appropriately by either adding or removing clock pulses which are counted by a timer from the execution of the low frequency oscillator when determining the appropriate sleep period.

Referring now to FIGS. 12 and 13, there is illustrated a manner for synchronization using the clock of a master device associated with the central controller unit and a slave associated with the remote transceiver unit. FIG. 12 illustrates the master/slave configuration. The master 1202 would be associated with the central controller unit 104 discussed herein above. The slave unit 1206 comprises the remote transceiver units 102 described above. The calibration information is provided from the master 1202 to the slave 1204 over the wireless communications link 1206 between these devices and the slave device 1204 alters their clock according to the calibration information provided from the master 1202.

This process is more fully described in FIG. 13. The slave is powered on at function block 1302. Once the slave has powered on, the slave monitors for the master clock over the wireless communication link 1206 at function block 1304. The slave next compares the detected master clock with its clock at function block 1306. Inquiry block 1308 determines whether the compared master and slave clocks are the same. If there are no differences between the two, the process ends at block 1312. However, if differences are detected between the master clock and the slave clock, the slave clock will adjust its clock frequency at Step 1310 in order to remove the detected differences.

Assuming that an on chip low frequency oscillator with sufficient tuning resolution is implemented, an internal oscillator could actually be more accurate than a crystal oscillator implementation since the internal oscillator will be calibrating to a 16 MHz oscillator that is inherently more accurate over temperature by a factor of three or more than commonly used low frequency crystal oscillators. This could provide a power savings in addition to cost saving when compared with the existing solutions. Furthermore, the use of single crystal oscillators within a system provides significant bill of material reductions and size reductions due to the elimination of one of the crystals. For instance, a 32.768 kHz crystal typically sells for 20 cents to 40 cents, and a 16 MHz crystal meeting 802.15.4 specs typically sells for 50 to 90 cents in production quantities. Elimination of either of these crystals would provide significant cost savings.

The use of the low frequency crystal rather than the high frequency crystal would inherently provide the largest bill of material savings but is much more difficult to implement for two primary reasons. First, the temperature stability of 32.768 KHz crystals makes it difficult to maintain frequency stabilities over wide temperature ranges, and second, the large delta between 32.768 KHz crystals and the multi GHz VCO frequency. While these problems are significant in the use of the low frequency oscillator crystal, any of the above-described implementations would be applicable with a configuration such as that illustrated in FIG. 5 wherein the low frequency crystal was used for calibrating a high frequency oscillator. This type of implementation would be much more feasible in applications wherein the temperature range over which the device would operate was much narrower than those envisioned in the 802.15.4 specification.

Although the preferred embodiment has been described in detail, it should be understood that various changes, substitutions and alterations can be made therein without departing from the scope of the invention as defined by the appended claims.

What is claimed is:

1. A method for calibrating a non-crystal oscillator in a transceiver unit using a crystal controlled oscillator, comprising the steps of:
    establishing a time base based upon oscillations of the crystal controlled oscillator;
    determining a number of oscillations of the crystal controlled oscillator during at least one period of the non-crystal oscillator;
    calculating a frequency of the non-crystal oscillator based upon the determined number of oscillations;
    changing the frequency of the non-crystal oscillator to approximately equal a target frequency responsive to the calculated frequency;
    controlling operation of the transceiver unit responsive to the changed frequency of the non-crystal oscillator.

2. The method of claim 1, wherein the step of determining further comprises the step of determining a frequency for the non-crystal oscillator in the transceiver unit based upon the established time base and the compared number of oscillations.

3. The method of claim 1, wherein step of changing further comprises the step of altering a stepped capacitance within the transceiver unit to change the frequency.

4. The method of claim 1, farther including the step of detecting an occurrence of a triggering event to initiate the calibration process.

5. A transceiver unit, comprising:
    a first oscillator circuit for providing a first clock signal;
    a second oscillator circuit for providing a second clock signal;
    a crystal associated with the second oscillator circuit for controlling the provision of the second clock signal;
    a transceiver for transceiving data from the transceiving unit; and
    a controller configured to:
        establish a time base based upon oscillations of the crystal;

determine a number of oscillations of the crystal controlled oscillator during at least one period of the non-crystal oscillator;

calculate a frequency of the non-crystal oscillator based upon the determined number of oscillations;

change the frequency of the non-crystal oscillator to approximately equal a target frequency responsive to the calculated frequency;

control operation of the transceiver responsive to the changed frequency of the non-crystal oscillator.

6. The transceiver unit of claim 5, wherein the controller is further configured to determine a frequency for the first oscillator circuit in the transceiving unit based upon the established time base and the compared number of oscillations.

7. The transceiver unit of claim 6, further including:
a CDAC for changing the frequency of the first oscillator circuit to approximately equal a target frequency based upon an oscillator frequency of the crystal, the CDAC controlled by the adjustment determined by the controller.

8. The transceiver unit of claim 7, wherein the adjustment alters a total capacitance provided by the CDAC to change the frequency.

9. The transceiver unit of claim 5, wherein the controller is further configured to initiate the calibration process responsive to detecting an occurrence of a triggering event.

10. A method for calibrating a non-crystal oscillator in a transceiver unit using a crystal controlled oscillator, comprising the steps of:

establishing a time base based upon the oscillations of the crystal controlled oscillator;

counting a number of pulses of the crystal controlled oscillator during at least one period of the non-crystal oscillator;

determining an amount of time in a period of the non-crystal oscillator responsive to the counted number of pulses; and controlling operation of the transceiver unit responsive to the non-crystal oscillator operating with the period having the determined period of time.

11. A method for calibrating a non-crystal oscillator in a transceiver unit using a crystal controlled oscillator, comprising the steps of:

establishing a time base based upon oscillations of the crystal controlled oscillator;

determining a number of oscillations of the crystal controlled oscillator during at least one period of the non-crystal oscillator;

calculating a frequency of the non-crystal oscillator based upon the determined number of oscillations;

changing the frequency of the non-crystal oscillator to approximately equal a target frequency responsive to the calculated frequency;

controlling operation of the transceiver unit responsive to the changed frequency of the non-crystal oscillator;

counting a number of pulses of the crystal controlled oscillator during at least one period of the non-crystal oscillator;

determining an amount of time in a period of the non-crystal oscillator responsive to the counted number of pulses; and controlling operation of the transceiver unit responsive to the non-crystal oscillator operating with the period having the determined period of time.

12. The method of claim 11, wherein step of changing the frequency farther comprises the step of altering a stepped capacitance within the transceiver unit to change the frequency.

13. The method of claim 11, farther including the step of detecting an occurrence of a triggering event to initiate the calibration process.

* * * * *